United States Patent
Pan et al.

(10) Patent No.: US 7,991,590 B2
(45) Date of Patent: Aug. 2, 2011

(54) ADAPTIVE REAL-TIME ANALYSIS METHOD FOR DYNAMIC SIGNALS GENERATED BY ROTARY MACHINES

(75) Inventors: Min-Chun Pan, Jhongli (TW); Cheng-Xue Wu, Jhongli (TW); Cian-De Ye, Jhongli (TW)

(73) Assignee: National Central University, Taoyuan (TW)

( * ) Notice: Subject to any disclaimer, the term of this patent is extended or adjusted under 35 U.S.C. 154(b) by 625 days.

(21) Appl. No.: 11/969,043

(22) Filed: Jan. 3, 2008

(65) Prior Publication Data
US 2009/0312979 A1    Dec. 17, 2009

(30) Foreign Application Priority Data
Dec. 5, 2007   (TW) .............................. 96146314 A

(51) Int. Cl.
*G01P 3/00* (2006.01)
(52) U.S. Cl. ......... 702/190; 702/145; 702/182; 702/196

(58) Field of Classification Search ............. 702/190
See application file for complete search history.

(56) References Cited

U.S. PATENT DOCUMENTS

| | | | | |
|---|---|---|---|---|
| 6,545,762 B2 * | 4/2003 | Lewis et al. | ............. | 356/502 |
| 6,675,187 B1 * | 1/2004 | Greenberger | ............. | 708/622 |
| 2005/0149234 A1 * | 7/2005 | Vian et al. | ............. | 700/279 |

* cited by examiner

*Primary Examiner* — Jonathan C Teixeira Moffat
(74) *Attorney, Agent, or Firm* — Chun-Ming Shih

(57) ABSTRACT

An adaptive real-time analysis method for dynamic signals generated by rotary machines improves Vold-Kalman filtering order tracing technology to renew the algorithm logic so that on-line computation ability is achieved. Through signal simulation and practical engineering application to verify the availability, it shows that the output results are extremely accurate. As such, this method is advantaged to estimate the time-domain waveform of specific order signals for the operation of the rotary machines and to interpret the related physical phenomena. Moreover, this method can be applied for a digital signal processor (DSP) to obtain real-time and on-line computation of the order signals needed to be traced and to display the tracing time-domain waveform instantly.

2 Claims, 6 Drawing Sheets

ADAPTIVE REAL-TIME ANALYSIS METHOD FOR DYNAMIC SIGNALS GENERATED BY ROTARY MACHINES

FIELD OF THE INVENTION

The present invention relates to an adaptive real-time analyzing method for dynamic signals generated by rotary machines, which changes the conventional Vold-Kalman filtering (VKF) order tracking method operated by the off-line operation mode, and can simultaneously track time domain waveforms having multiple orders. The method can tremendously decrease both memory space and computation time of operating arrays by computers, and can analyze acquired data with an adaptive and real-time manner through a digital signal processor (DSP) and monitor rotary machines on-line and real-timely.

DESCRIPTION OF THE RELATED ART

Rotary machines in the manufacturing industry once arise faults or lose effectiveness; they will greatly influence the market competition ability of companies. The above rotary machines may be applied in the systems of motors, engines, cutting machines (such as lathes and milling machines), automobiles and power-steering ships, etc.

Rotary machines applied in industry, usually are dynamically varied to some extent. If faults occur in rotary machines, they may yield corresponding significant vibratory responses. Therefore, to maintain the stability of the rotary machines and prevent producing the faults, order tracking methods are employed to analyze the locations of the faults produced by the rotary machines.

Different conventional order tracking methods have been developed in past decades. However, each has many disadvantages described as the following.

A foreign prior art discloses a high-resolution intelligent order diagnosis system and a corresponding diagnosis method. The diagnosis system is configured for analyzing and diagnosing frequency order of the rotary machines. The diagnosis system includes a data pickup device, a data setting device, a frequency spectrum analyzing and resampling device, a Kalman filter or a recursive least-squares (RLS) analyzing device, a fuzzy set device and a graphical user interface (GUI) device. The above devices are operated over and over to obtain the diagnosing results of the rotary machines at any time.

Another foreign prior art provides a system to monitor a rotating machine. The system employs an adaptive analyzing method for dynamic signals to determine a rotating speed of the rotating machine.

Other foreign prior art provides an analyzing system and method for dynamic signals to analyze a machine having rotating elements. The input signals are time-frequency analyzed and inserted into an array. The array is processed to form an inverse array for obtaining time-frequency signals. The time-frequency signals are displayed on a human machine interface to observe the machine.

Other foreign prior art discloses an analyzing method for signals produced by a machine having at least one rotating element. The operating mode thereof employs a Gabor converting method for time-frequency convention of inputting signals.

However, the above prior arts have many disadvantages described as the following:

(1) The conventional methods do not employ an adaptive real-time VKF order tracking analysis disclosed in the present invention, and employ an one-step prediction computation scheme to real-time analyze the signals acquired from the rotary machines.

(2) The order analysis based on VKF, is usually an order tracking analysis and operation for off-line operation. The order analysis cannot obtain real-time monitoring capability.

(3) The conventional order tracking analysis need to employ another assumed converting function for signals. Since the signals need the assumed converting function, the conventional order tracking analysis has the common disadvantageous.

(4) Operating flow for two order analysis disclosed by Vold, needs to pick up whole signals, and be operated by a least-squares operating mode. The computation needs large memory space of the computer, and costs much time.

What is needed is an adaptive real-time analysis method for resolving the above disadvantages, and monitoring, predicting and evaluating the devices and products to work out a maintaining plan for preventing faults.

BRIEF SUMMARY

Since the conventional order tracking analysis methods do not obtain real-time monitoring capability and have many common disadvantages, the inventors of the present invention investigate for long time, and then invent an adaptive real-time analysis method for dynamic signals produced by rotary machines during operation.

An object of the present invention is providing an adaptive real-time analysis method for dynamic signals produced by rotary machines. The present method is different from the conventional methods. The present method can order track the dynamic signals, such as vibrations, noises, etc. of the rotary machines to diagnose the locations of the faults produced in the rotary machines, and monitor in a real-time manner. The present method can track waveforms of specific orders with high precisions for the rotary machines in operation, and interpret related physical phenomenons. The present method can operate real-time on the DSP to observe real-time waveforms of the tracking orders. Therefore, the present method is valuable to be applied in related industries, such as data-acquisition instrument manufacturing companies, the rotatary machinery corporations and vehicle manufacturing companies, etc.

Other objects, advantages and novel features of the invention will become more apparent from the following detailed description when taken in conjunction with the accompanying drawings, in which:

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
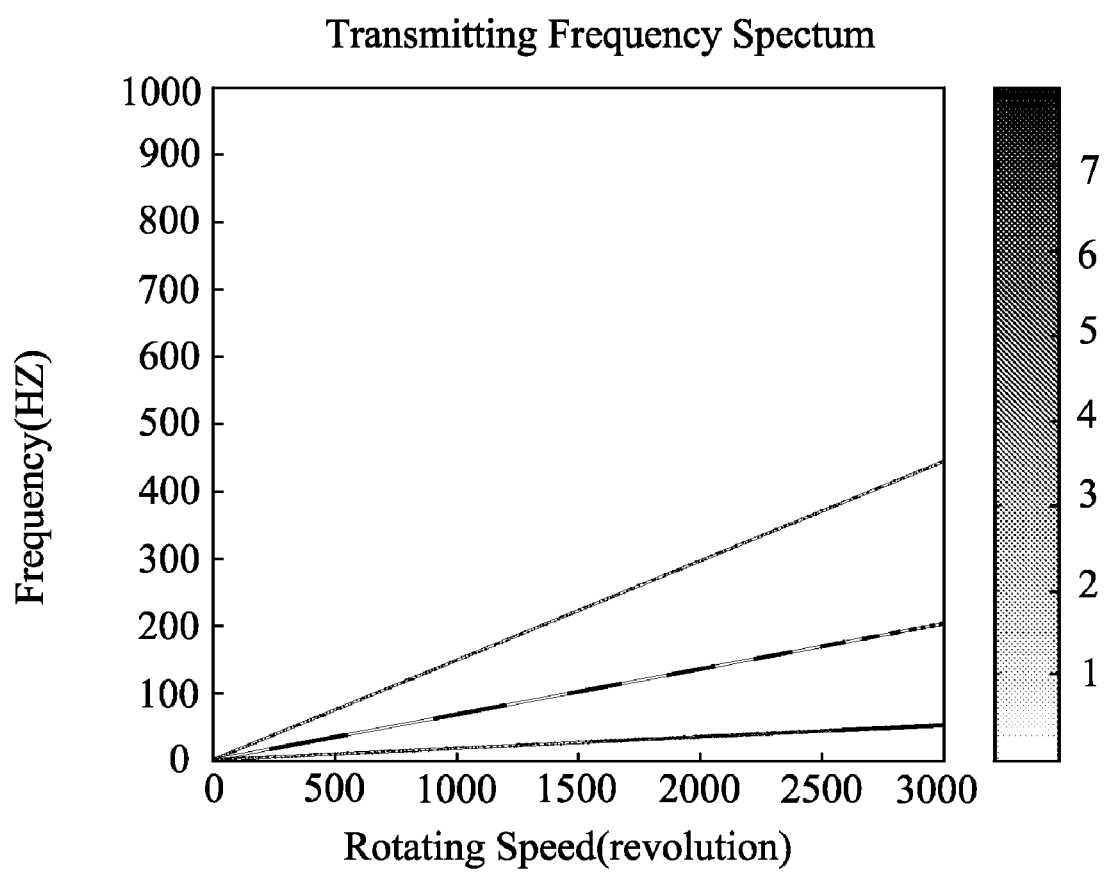
FIG. 1 is a transmitting frequency spectum graph of adjacent orders analog signals.
Figure 2:
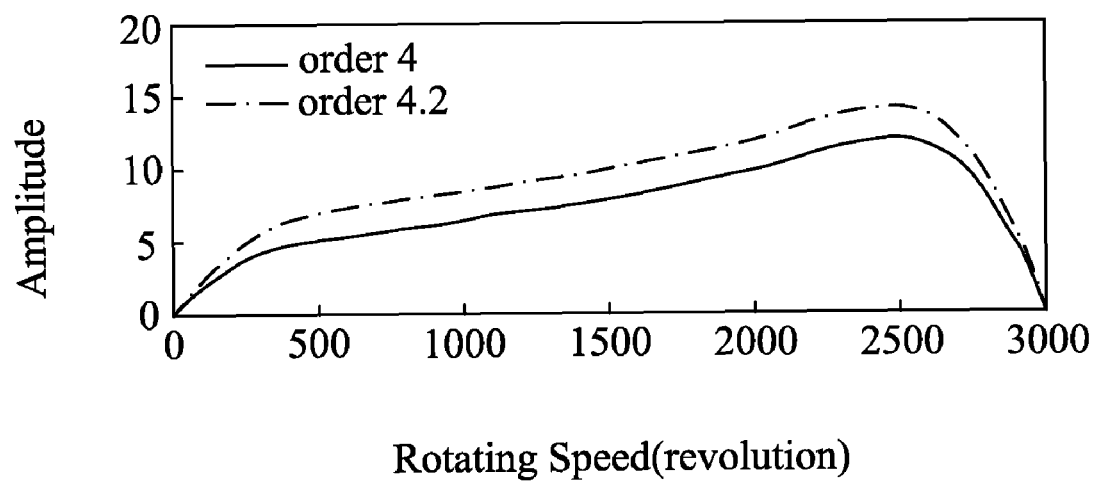
FIG. 2 shows amplitudes of 4 orders and 4.2 orders tracked by the adjacent orders analog signals respectively by using (a) angular displacements VKF order tracking and (b) adaptive angular displacements VKF order tracking.
Figure 2:
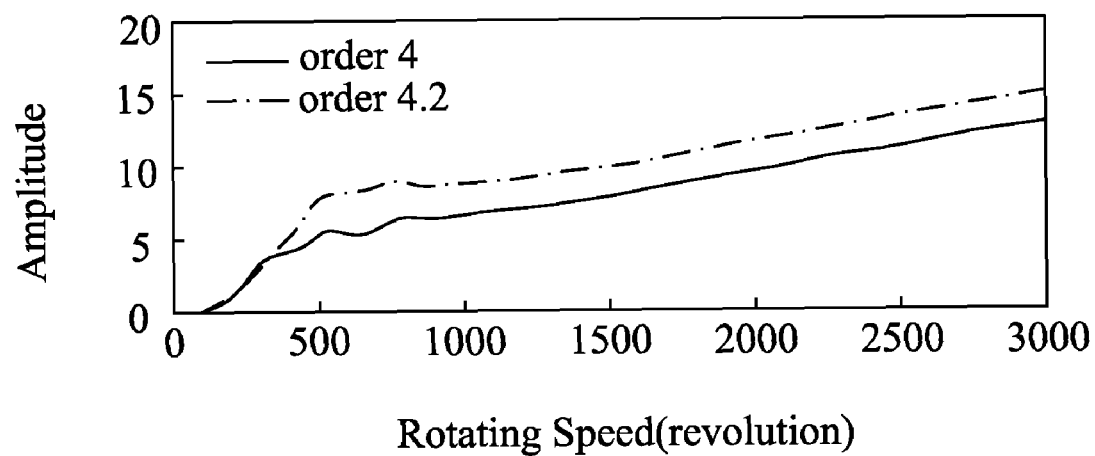
Figure 3:
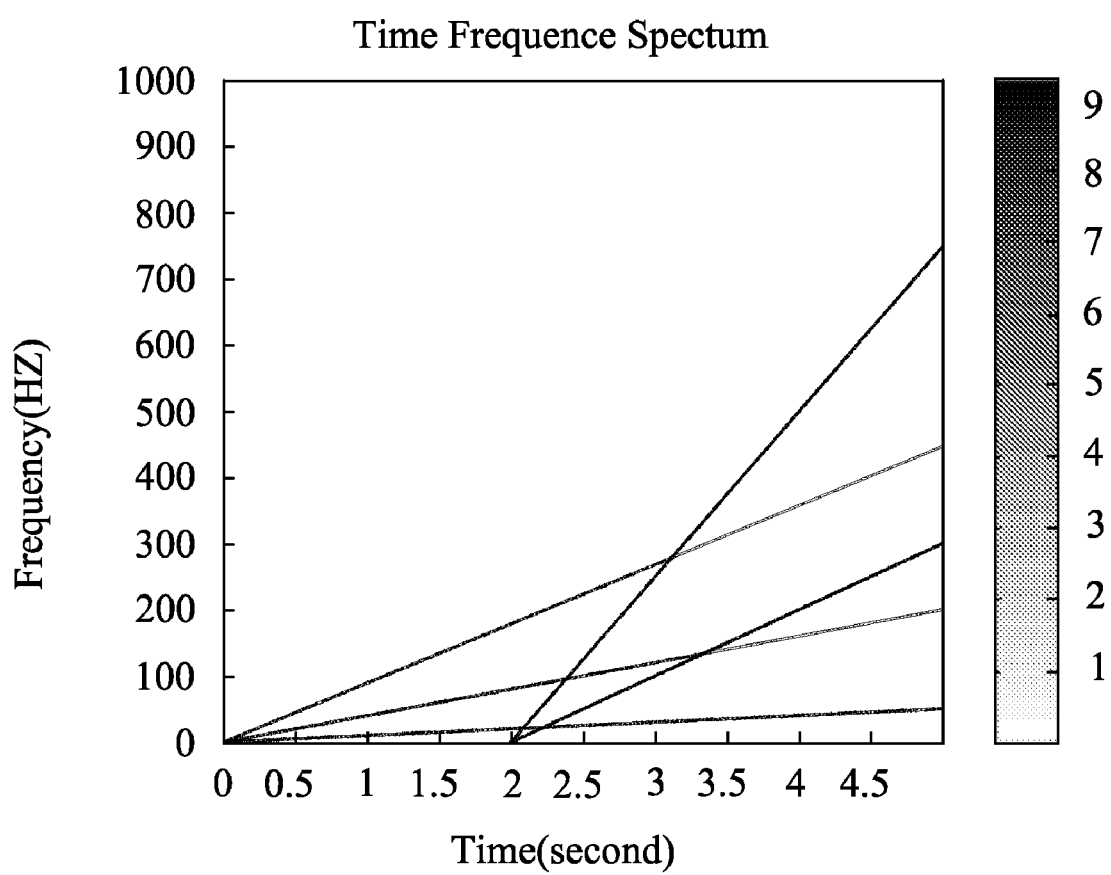
FIG. 3 is a transmitting frequency spectum graph of interlaced orders analoy signals.
Figure 4:
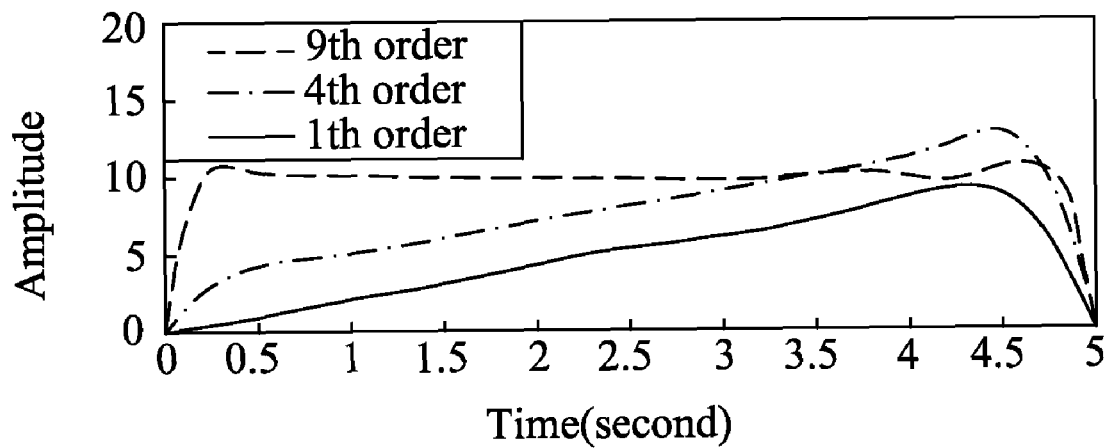
FIG. 4 shows amplitudes of 1, 4, and 9 orders tracked by interlaced order analoy signals respectively by using (a) angular displacements VKF order tracking and (b) adaptive angular displacements VKF order tracking.
Figure 4:
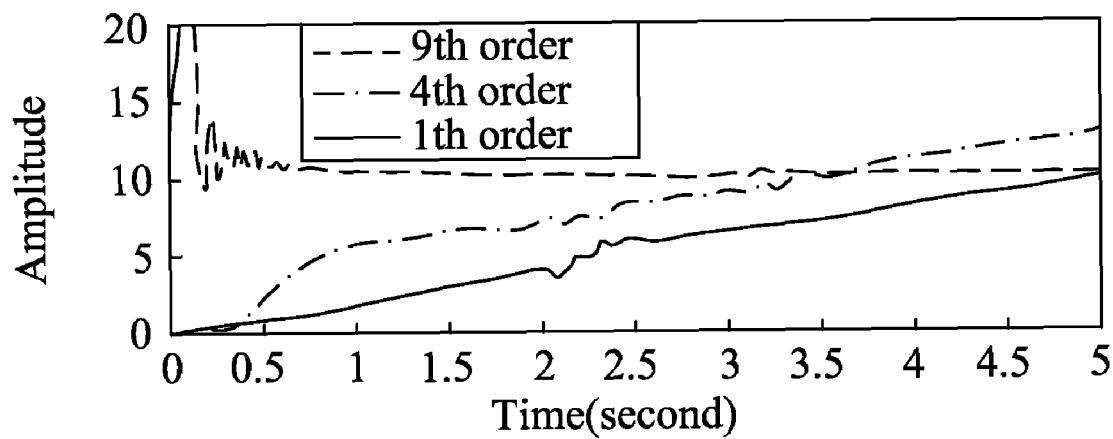

Reference will now be made to the drawings to describe a preferred embodiment of the present adaptive real-time analysis method for dynamic signals generated by rotary machines, in detail.

The present invention relates to an adaptive real-time analysis method for dynamic signals generated by rotary machines. The method converts a conventional VKF order tracking structure equation $$y(n) = \sum_{k \in j} a_k(n)\theta_k(n) + \xi(n),$$

and a data equation $\nabla^s a_k(n) = \psi_k(n)$, $s=2$ to a process equation $A(n+1)=F(n+1, n)A(n)+Z(n)$, and a measurement equation $y(n)=B(n)A(n)+\xi(n)$ of a Kalman filter, where $y(n)$ is a measured signal, $a_k(n)$ is the envelope of a $k^{th}$-order signal, $\theta_k(n)$ is a $k^{th}$-order carrier signal, $\xi(n)$ is other order components not to be tracked and noise/artifacts in the measured signal, and $\psi_k(n)$ denotes a higher-degree term in $a_k(t)$, generated by a noise and other signals. The method works by a one-step prediction computation scheme to solve an order component to be tracked and obtained.

The method of the present invention operates by a one-step prediction recursive method after being converted to those of the Kalman filter, to real-time analyze updated data of signals. Therefore, the method is essentially adaptive and real-time.

The method of the present invention is different from the conventional VKF order tracking methods, which need to premeasure all signals of a whole time period, and process the relation of the orders and the measured signals by an off-line operating mode to form a matrix and vector shape by the above structure equation and the data equation, then solve a solution of the order signal of the time period by the complicated matrix operation.

The one-step prediction scheme of the present method is $G(n)=r(n)F(n+1,n)K(n,n-1)B^H(n)[B(n)K(n,n-1)B^H(n)+Q_2(n)]^{-1}$ $\alpha(n)=y(n)-B(n)\hat{A}(n|y_{n-1})$ $r(n)\hat{A}(n+1|y_n)=r(n)F(n+1,n)\hat{A}(n|y_{n-1})+G(n)\alpha(n)$ $K(n)=K(n,n-1)-r^{-1}(n)F(n,n+1)G(n)B(n)K(n,n-1)$ $r^2(n)K(n+1,n)=r(n)F(n+1,n)K(n)r(n)F^H(n+1,n)+r^2(n)Q_1(n)$ The above signs are described as the following chart:

| Variable | Definition | Dimension |
|---|---|---|
| A(n) | State at time n | 2K by 1 |
| y(n) | Observation at time n | 1 by 1 |
| F(n + 1, n) | Transition matrix from time n to time n + 1 | 2K by 2K |
| B(n) | Measurement matrix at time n | K1 by 2K |
| Q₁(n) | Correlation matrix of process noise Z(n) | 2K by 2K |
| Q₂(n) | Correlation matrix of measurement noise ξ(n) | 1 by 1 |
| Â(n + 1 | yₙ) | Predicted estimate of the state at time n + 1 given the observations y(1), y(2), ..., y(n) | 2K by 1 |
| Â (n | yₙ) | Filtered estimate of the state at time n given the observations y(1), y(2), ..., y(n) | 2K by 1 |
| G(n) | Kalman gain at time n | 2K by 1 |
| α(n) | Innovations vector at time n | 1 by 1 |
| K(n + 1, n) | Correlation matrix of the error in Â(n + 1 | yₙ) | 2K by 2K |
| K(n) | Correlation matrix of the error in Â (n | yₙ) | 2K by 2K |
| r(n) | Weighting factor at time n | 1 by 1 | wherein H represents the Hermitian conjugate.

Figure 5:
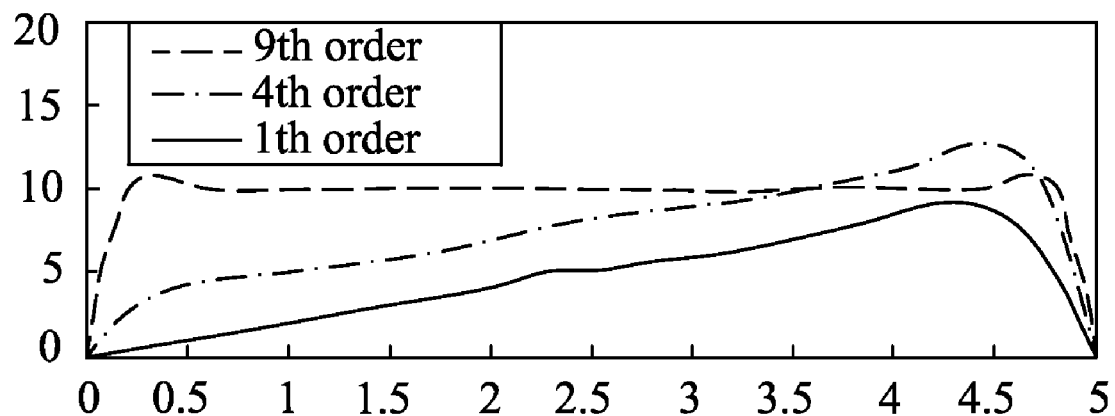
FIG. 5 shows amplitudes of 9 orders by adjusting various weight factors through adaptive angle displacement VKF order tracking.
Figure 5:
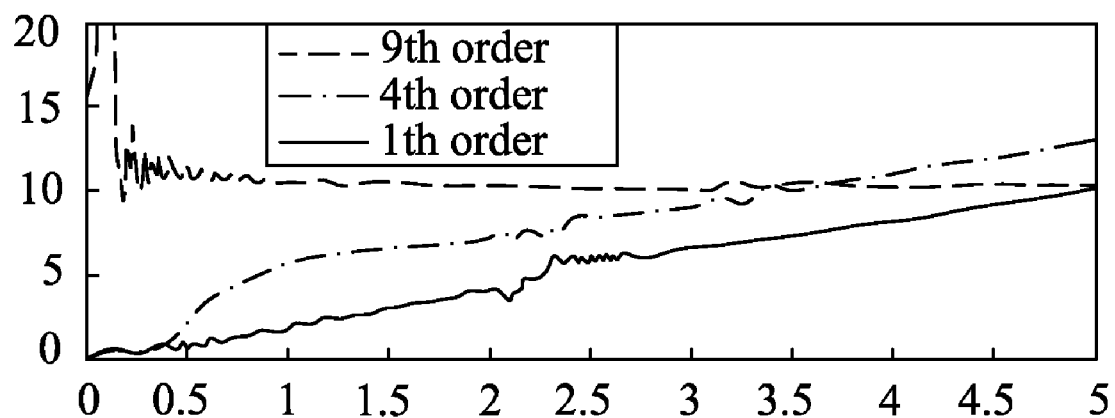

The method of the present invention has been proved by processing three-group analog signals composed of different orders to compare with the conventional methods. FIGS. 1, 2, 3, and 4, are respectively a transmitting frequency spectrum graph of adjacent orders analog signals, amplitudes of 4 order and 4.2 order tracked by the adjacent orders analog signals respectively by using (a) angular displacements VKF order tracking and (b) adaptive angular displacements VKF order tracking, and a transmitting frequency spectrum graph of interlaced orders analoy signals, amplitudes of 1, 4, 9 orders tracked by interlaced order analoy signals respectively by using (a) angular displacements VKF order tracking and (b) adaptive angular displacements VKF order tracking ralating graphs. Various parameters, which influence order tracking capability, such as weighting factor (as shown in FIG. 5), matrix relating to process noise, environmental noise, are discussed.

Figure 6:
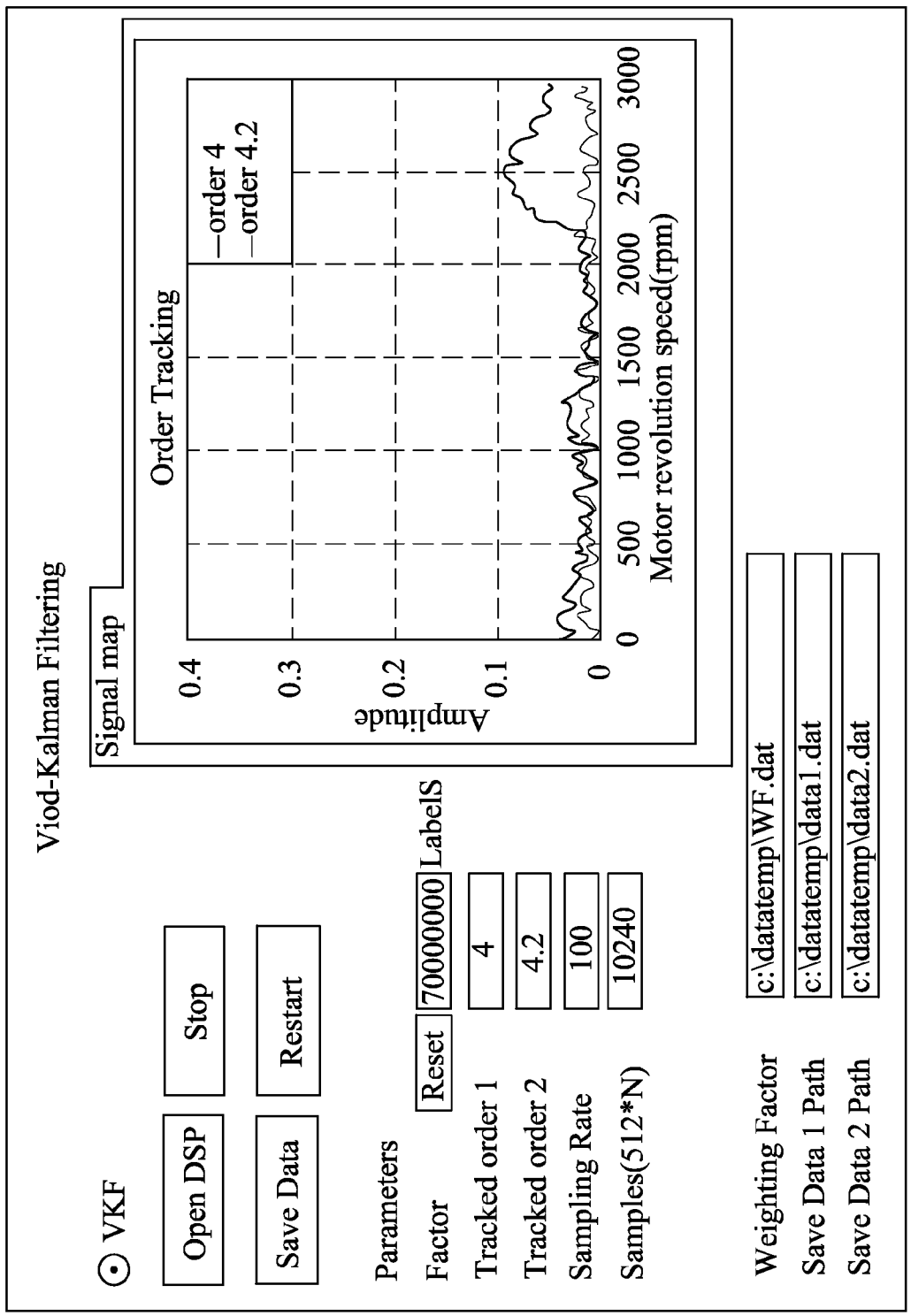
FIG. 6 is a monitoring real-time graph of vibration signals of a transmission system test bench.

An experiment is used to verify the present method applied on a transmission system test bench. The transmission system test bench measures rotating signals by using accelerations, accurate microphones on a rotating machine, rotating signals by a rotating measure. The relating signals are processed by a digital signal processor. Referring to FIG. 6, a monitoring schematic view of the vibrating signals of a test bench is shown. The test proves that the method of the present invention can be used in the digital signal processor. The signals and the order values of the multi-axises rotating system of adjacent or interlaced separated orders, are obtained real-time to operate real-time and monitor real-time, such that they can be applied in the machine fault diagnosis system.

From the above, the present method compared with the conventional methods has many advantages described as following:

(1) The present method is novel. Since the conventional VKF order tracking methods are operated by using the least square to make the sum of two error energys minimum and obtain data of the order signals, which need operated by the off-line mode, the present adaptive real-time analyzing method for dynamic signals produced by the rotary machines, is a real-time operating method, therefore, the present method is more effective in use.

(2) The present method is nonobvious. The conventional VKF order tracking methods need the structure equation and the data equation to form the matrix and vector shape, such that the conventional methods need large memory space and long time when the data are large. The present adaptive real-time analyzing method for dynamic signals produced by the rotary machines solves the disadvantageous produced by the conventional methods by using the one-step prediction scheme to operate real-time.

(3) The present method is practical. The present method is a signal processing method based on the Kalman filter to monitor real-time.

(4) The present method has a high precision relating to the waveform of time-period of the specific order signals of operating the rotary machines, and the relating physical phenomenons. The present method can operate real-time on the DSP to observe real-time the time waveform of the tracking orders.

Therefore, the present method is novel, nonobvious, and practical. Furthermore, the present method is valuable in the relating industries (such as, the data obtaining devices manufacturing companies, the rotary machines and vehicle manufacturing companies).

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An adaptive real-time analysis method for dynamic signals produced by rotary machines, comprising:
   providing a machine fault diagnosing device and system;
   using a digital signal processor (DSP) of the machine fault diagnosing device and system to perform converting a structure equation $$y(n) = \sum_{k \in j} a_k(n)\theta_k(n) + \xi(n)$$

and a data equation $\nabla^s a_k(n) = \psi_k(n)$, s=2 of conventional Vold-Kalman filtering (VKF) order tracking to a process equation and a measurement equation of Kalman filtering, where y(n) is a measured signal, $a_k(n)$ is an envelope of a $k^{th}$-order signal, $\theta_k(n)$ is a $k^{th}$-order carrier signal, $\xi(n)$ is an order component not to be tracked and noise in the measured signal, and $\psi_k(n)$ denotes a higher-degree term in $a_k(n)$, generated by a noise and other signals; and
computing by means of a one-step prediction scheme to obtain a tracked order component or multiple order components.

2. The method as claimed in claim 1, wherein the process equation is $A(n+1)=F(n+1,n)A(n)+Z(n)$ and the measurement equation is $y(n)=B(n)A(n)+\xi(n)$, and the one-step prediction scheme is $$G(n)=r(n)F(n+1,n)K(n,n-1)B^H(n)[B(n)K(n,n-1)B^H(n)+Q_2(n)]^{-1}$$

$$\alpha(n)=y(n)-B(n)\hat{A}(n|y_{n-1})$$

$$r(n)\hat{A}(n+1|y_n)=r(n)F(n+1,n)\hat{A}(n|y_{n-1})+G(n)\alpha(n)$$

$$K(n)=K(n, n-1)-r^{-1}(n)F(n, n+1)G(n)B(n)K(n, n+1)$$

$$r^2(n)K(n+1,n)=r(n)F(n+1, n)K(n)r(n)F^H(n+1,n)+r^2(n)Q_1(n)$$

wherein

| Variable | Definition | Dimension |
| --- | --- | --- |
| A(n) | State at time n | 2K by 1 |
| y(n) | Observation at time n | 1 by 1 |
| F(n + 1, n) | Transition matrix from time n to time n + 1 | 2K by 2K |
| B(n) | Measurement matrix at time n | K1 by 2K |
| $Q_1(n)$ | Correlation matrix of process noise Z(n) | 2K by 2K |
| $Q_2(n)$ | Correlation matrix of measurement noise $\xi(n)$ | 1 by 1 |
| $\hat{A}(n + 1 \mid y_n)$ | Predicted estimate of the state at time n + 1 given the observations y(1), y(2), ..., y(n) | 2K by 1 |
| $\hat{A}(n \mid y_n)$ | Filtered estimate of the state at time n given the observations y(1), y(2), ..., y(n) | 2K by 1 |
| G(n) | Kalman gain at time n | 2K by 1 |
| $\alpha(n)$ | Innovations vector at time n | 1 by 1 |
| K(n + 1, n) | Correlation matrix of the error in $\hat{A}(n + 1 \mid y_n)$ | 2K by 2K |
| K(n) | Correlation matrix of the error in $\hat{A}(n \mid y_n)$ | 2K by 2K |
| r(n) | Weighting factor at time n | 1 by 1 | and wherein H represents the Hermitian conjugate.

* * * * *